United States Patent
Tomioka et al.

(10) Patent No.: US 10,418,436 B2
(45) Date of Patent: Sep. 17, 2019

(54) DISPLAY DEVICE

(71) Applicant: Japan Display Inc., Minato-ku (JP)

(72) Inventors: Yasushi Tomioka, Tokyo (JP); Hajime Yamaguchi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/977,377

(22) Filed: May 11, 2018

(65) Prior Publication Data

US 2018/0337367 A1    Nov. 22, 2018

(30) Foreign Application Priority Data

May 16, 2017 (JP) ................................. 2017-097183

(51) Int. Cl.
  *H01L 27/32*   (2006.01)
  *H01L 51/52*   (2006.01)
  *H01L 51/00*   (2006.01)

(52) U.S. Cl.
  CPC ...... *H01L 27/3276* (2013.01); *H01L 51/0097* (2013.01); *H01L 51/5203* (2013.01); *H01L 51/5253* (2013.01); *H01L 51/5256* (2013.01); *G02F 2201/121* (2013.01); *G02F 2201/123* (2013.01); *H01L 2251/5338* (2013.01)

(58) Field of Classification Search
  None
  See application file for complete search history.

(56) References Cited

U.S. PATENT DOCUMENTS 9,276,055 B1 *   3/2016  Son ..................... H01L 27/3276
2014/0353670 A1  12/2014 Youn et al.
2015/0287750 A1  10/2015 Youn et al.
2017/0371194 A1  12/2017 Tomioka et al.
2017/0371195 A1  12/2017 Tomioka et al.
2018/0315809 A1*  11/2018 Kim .................... H01L 27/3276

FOREIGN PATENT DOCUMENTS

JP    2014-232300    12/2014
JP    2017-227827    12/2017
JP    2017-227830    12/2017

OTHER PUBLICATIONS

BCB Properties, downloaded from UR<http://pubs.acs.org/subscribe/archive/ci/31/i12/html/12so_box.html> on Dec. 13, 2018.*
Polymer Properties Database downloaded from URL<http://polymerdatabase.com/polymer%20physics/Polymer%20Tg.html> on Dec. 13, 2018.*
Macdonald, W. A., et al. "Latest Advances in Substrates for Flexible Electronics." Journal of the Society for Information Display, vol. 15, No. 12, 2007, p. 1075., doi:10.1889/1.2825093.*
Definition of elongated downloaded from URL< https://www.merriam-webster.com/dictionary/elongate> on Feb. 5, 2019.*

* cited by examiner

*Primary Examiner* — J. E. Schoenholtz
(74) *Attorney, Agent, or Firm* — Oblon, McClelland, Maier & Neustadt, L.L.P.

(57) ABSTRACT

According to one embodiment, a display device includes an insulating substrate having a display area, a pad area and a bend area, wiring lines, a first protective film and a second protective film. The wiring lines are elongated from the display area to the pad area. The first protective film is located on the insulating substrate and the wiring lines. The second protective film is located on the first protective film and is formed of an organic insulating material different from that of the first protective film.

8 Claims, 13 Drawing Sheets

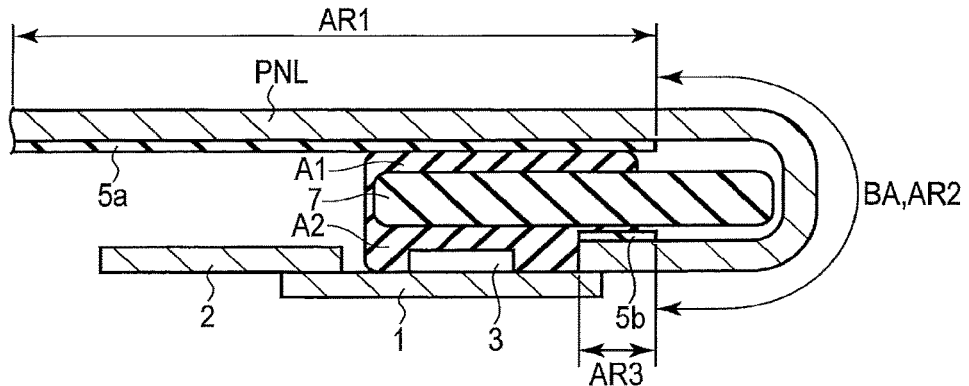
F I G. 4
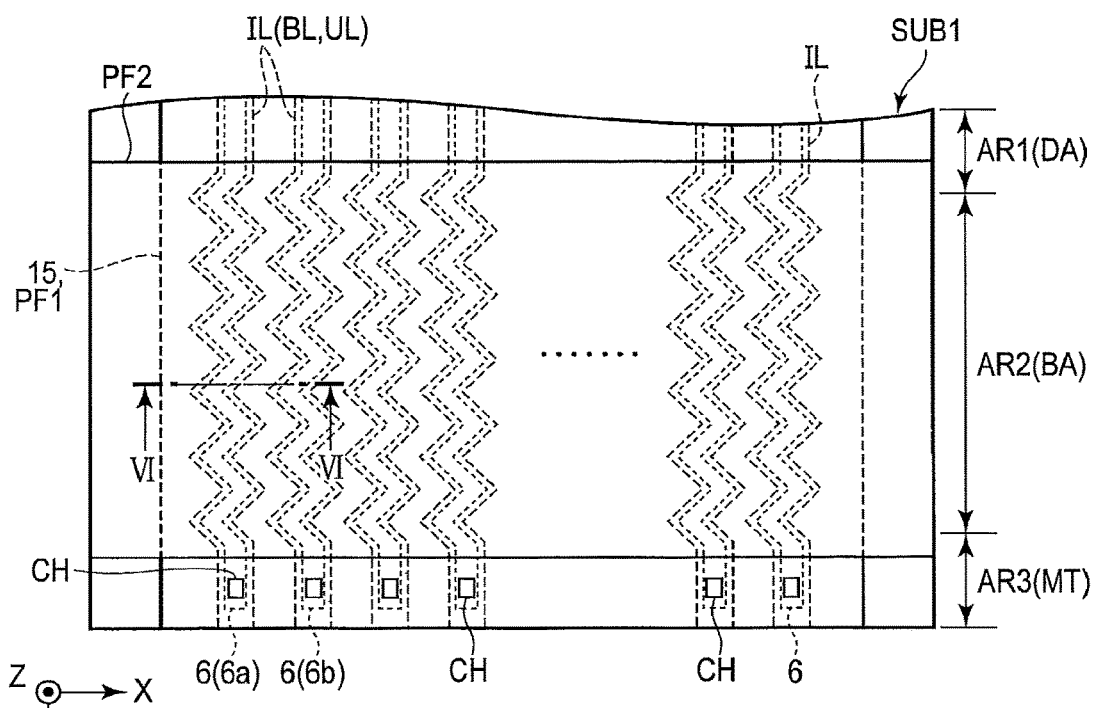
F I G. 5

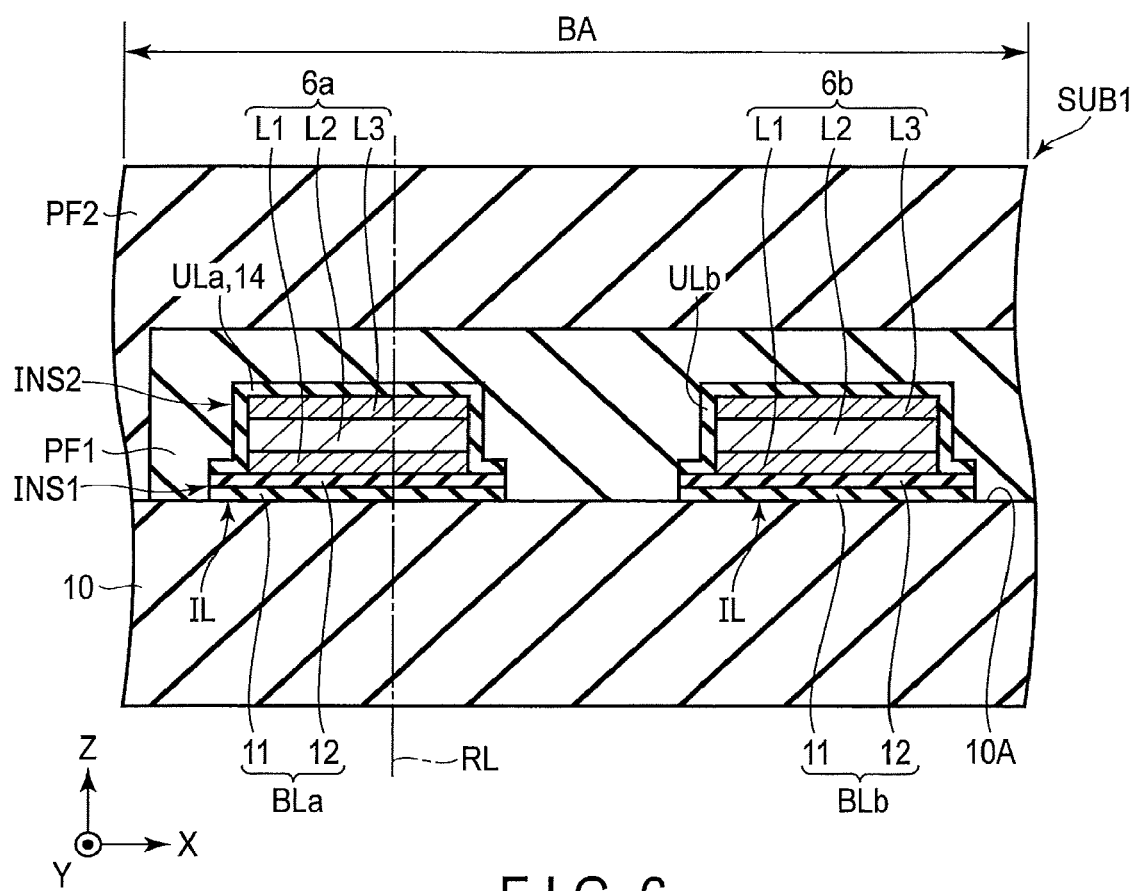
F I G. 6

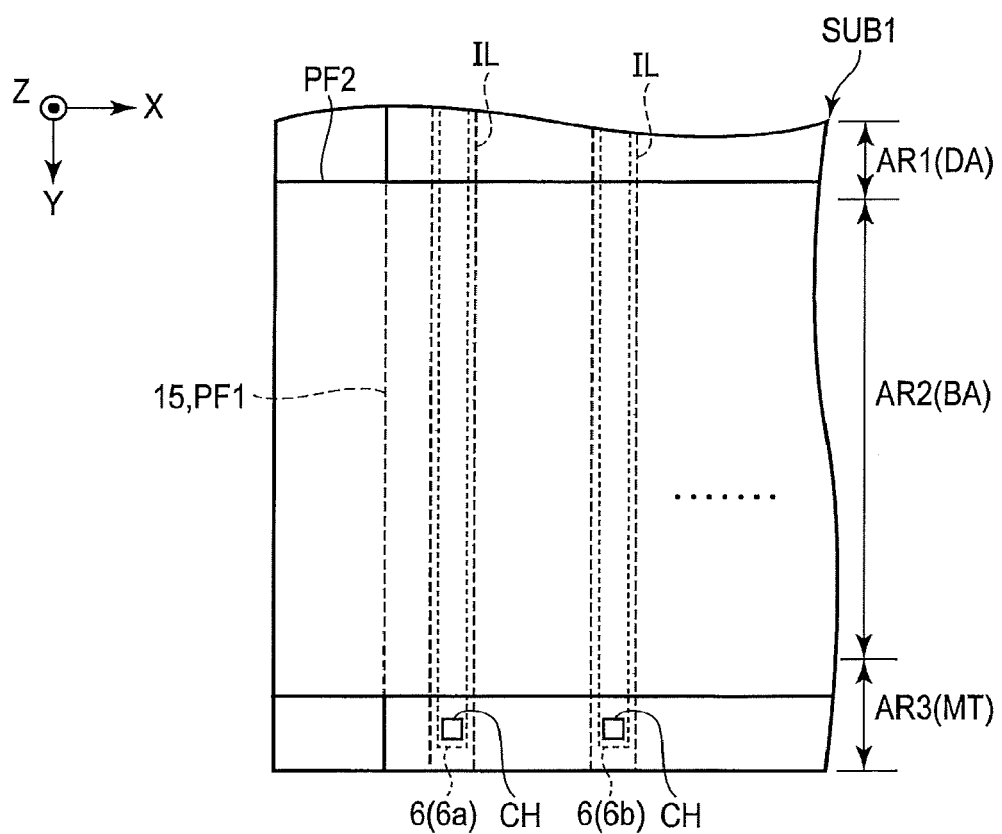
F I G. 7

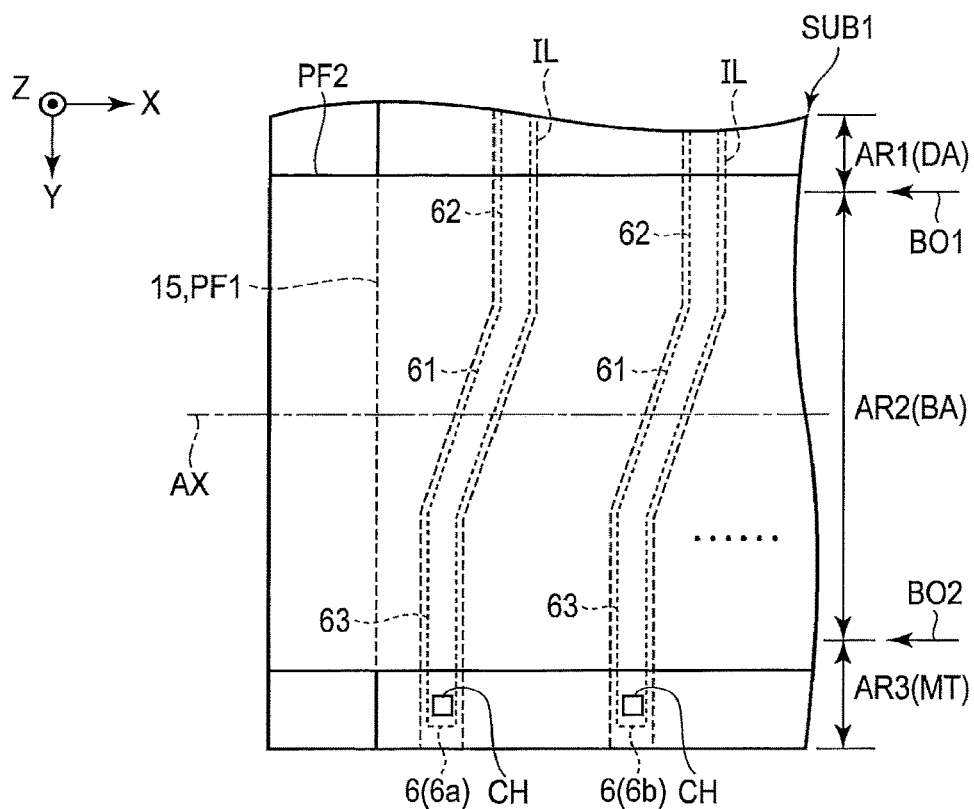
F I G. 8
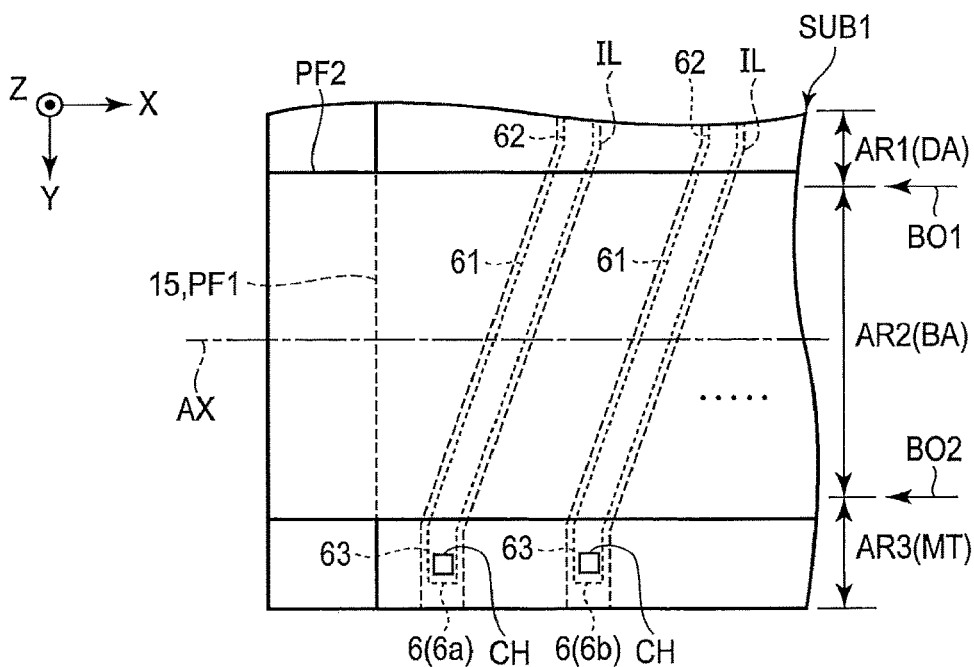
F I G. 9

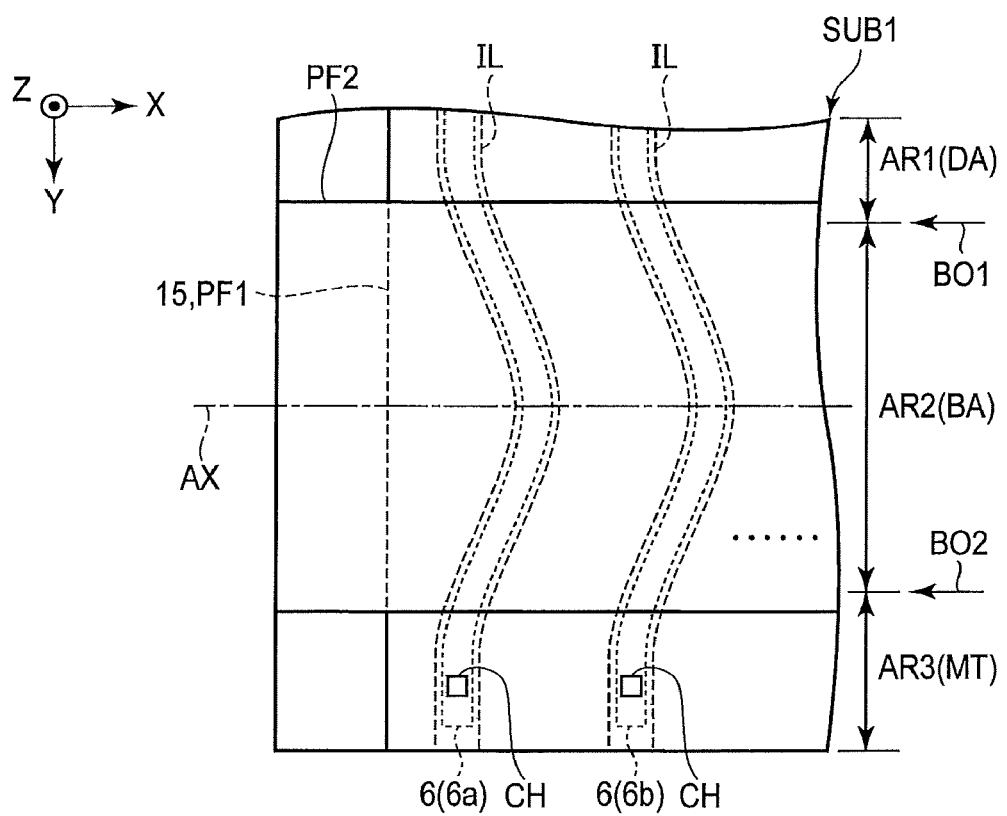
F I G. 10

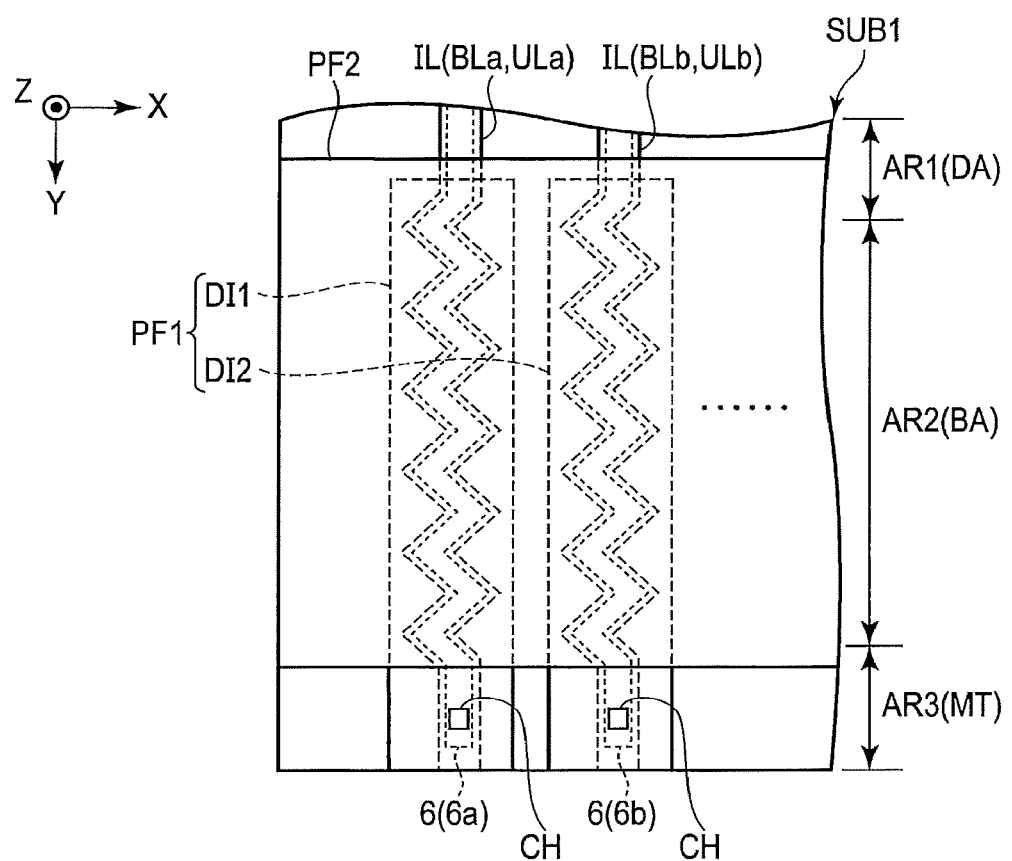
F I G. 11

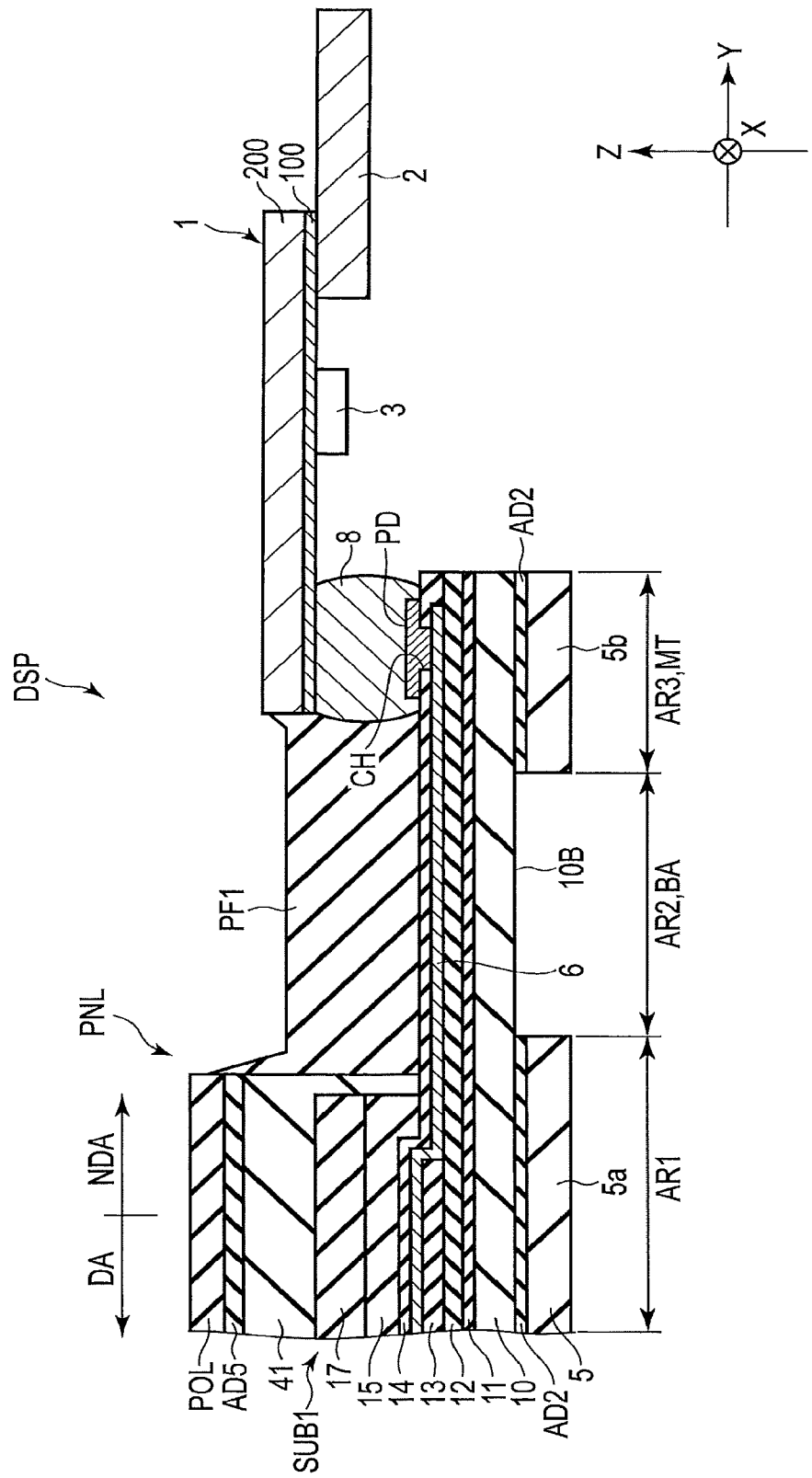
F I G. 14

DISPLAY DEVICE

CROSS-REFERENCE TO RELATED APPLICATIONS

This application is based upon and claims the benefit of priority from Japanese Patent Application No. 2017-097183, filed May 16, 2017, the entire contents of which are incorporated herein by reference.

FIELD

Embodiments described herein relate generally to a display device.

BACKGROUND

Recently, commercialization of sheet-like display devices using flexible substrates has been in progress. These display devices are gaining attention as light and thin display devices. For example, a polyimide film formed of a coating of a polyimide precursor solution (PI film) is used for the flexible substrates. To narrow the frames of the display devices, the flexible substrates are bent when the flexible substrates are accommodated in electronic devices, etc.

BRIEF DESCRIPTION OF THE DRAWINGS

FIG. 4 is another sectional view of the display device and shows a state where a bend area of a display panel is bent.

FIG. 5 is a plan view of part of a first substrate of the display panel and shows the bend area, etc.

FIG. 6 is a sectional view of the first substrate taken along line VI-VI of FIG. 5.

FIG. 7 is a plan view of part of a first substrate of a display panel according to modification example 1 of the first embodiment and shows a bend area, etc.

FIG. 8 is a plan view of part of a first substrate of a display panel according to modification example 2 of the first embodiment and shows a bend area, etc.

FIG. 9 is a plan view of part of a first substrate of a display panel according to modification example 3 of the first embodiment and shows a bend area, etc.

FIG. 10 is a plan view of part of a first substrate of a display panel according to modification example 4 of the first embodiment and shows a bend area, etc.

FIG. 11 is a plan view of part of a first substrate of a display panel according to modification example 5 of the first embodiment and shows a bend area, etc.

FIG. 14 is a sectional view of a display device according to the second embodiment and shows a non-display area, etc.

DETAILED DESCRIPTION

Figure 1:
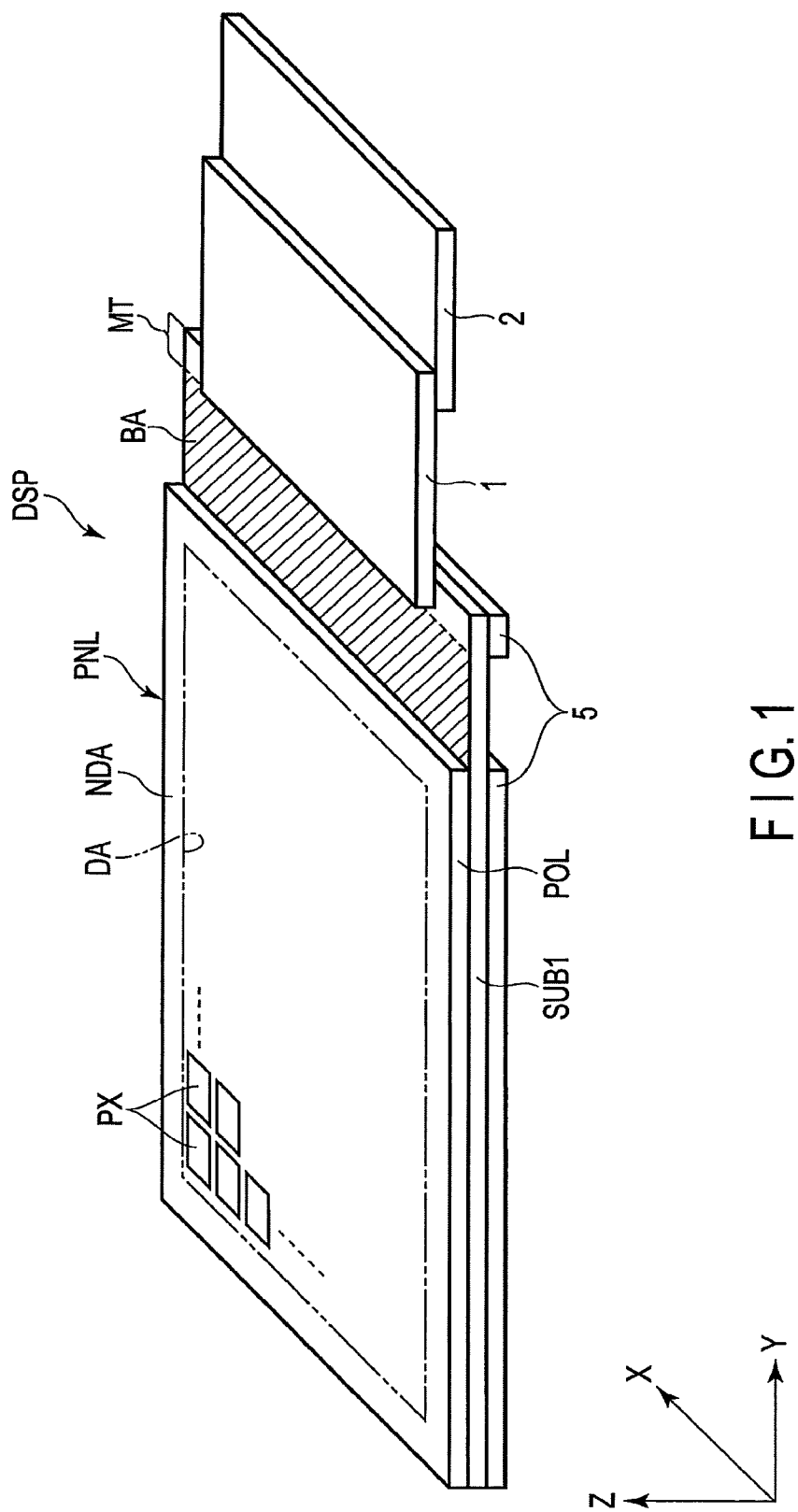
FIG. 1 is a perspective view showing the structure of a display device according to the first embodiment.

In general, according to one embodiment, there is provided a display device including an insulating substrate which has a display area, a pad area and a bend area located between the display area and the pad area, a plurality of wiring lines which are formed on the insulating substrate and are elongated from the display area to the pad area, a first protective film which is located on the insulating substrate and the wiring lines in the bend area and is formed of an organic insulating material, and a second protective film which is located on the first protective film in the bend area and is formed of an organic insulating material different from the organic insulating material of the first protective film.

According to another embodiment, there is provided a display device including an insulating substrate which has a display area, a pad area, and a bend area located between the display area and the pad area, a plurality of wiring lines which are formed on the insulating substrate and are elongated from the display area to the pad area, and a first protective film which is located on the insulating substrate and the wiring lines in the bend area and is formed of an organic insulating material. The glass-transition temperature of the first protective film is less than −40° C. or more than 85° C.

Embodiments and modification examples will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless necessary.

First Embodiment

Firstly, a display device according to the first embodiment will be described. FIG. 1 is a perspective view showing the structure of a display device DSP according to the present embodiment.

As shown in FIG. 1, a first direction X and a second direction Y perpendicularly intersect each other. A third direction Z perpendicularly intersects the first direction X and the second direction Y. Unlike the present embodiment, the first direction X and the second direction Y may intersect each other at an angle other than an angle of 90°. The present embodiment will be described based on the assumption that the display device is an organic electroluminescent (EL) display device.

In the present embodiment, a direction from a first substrate SUB1 to a polarizer POL (a direction of the pointing end of an arrow indicating the third direction Z) is defined as above, and a direction from the polarizer POL to the first substrate SUB1 (a direction opposite to the direction of the pointing end of the arrow indicating the third direction Z) is defined as below. Further, such expressions as "a second member above a first member" and "a second member below a first member" mean that the second member may be in contact with the first member or may be away from the first member.

The display device DSP includes a display panel PNL, a wiring substrate 1 and a wiring substrate 2. The display panel PNL includes the first substrate SUB1, the polarizer POL opposed to the first substrate SUB1, and a support member 5. In the present embodiment, the display panel PNL is an organic EL display panel having an organic EL element OLED as an electro-optical element.

The display panel PNL includes a display area DA on which an image is displayed, and a non-display area NDA which is located outside the display area DA. The display panel PNL includes a plurality of pixels PX in the display area DA. The pixels PX are arranged in a matrix in the first direction X and the second direction Y.

The first substrate SUB1 has a pad area MT located outside an area which overlaps the polarizer POL. More specifically, three edges of the first substrate SUB1 are aligned with three edges of the polarizer POL in the third direction Z. An edge of the first substrate SUB1 which is parallel to the first direction X and an edge of the polarizer POL which is parallel to the first direction X have a substantially equal length. Further, an edge of the first substrate SUB1 which is parallel to the second direction Y is longer than an edge of the polarizer POL which is parallel to the second direction Y. That is, the area of the first substrate SUB1 which is parallel to an X-Y plane is larger than the area of the polarizer POL which is parallel to the X-Y plane. Here, the X-Y plane is a plane defined by the first direction X and the second direction Y.

In the example illustrated, the wiring substrate 1 is mounted on the pad area MT in the non-display area NDA. An edge of the wiring substrate 1 which is parallel to the first direction X is shorter than an edge of the first substrate SUB1 and an edge of the polarizer POL which are parallel to the first direction X in the example illustrated but may be equal to each other. The wiring substrate 1 is coupled to the display panel PNL. The wiring substrate 2 is arranged below the wiring substrate 1 and is coupled to the wiring substrate 1.

The wiring substrates 1 and 2 are flexible substrates, for example. As the flexible substrate applicable to the present embodiment, at least part of the flexible substrate includes a flexible portion formed of a bendable material.

In the present embodiment, the display device DSP has a bend area BA which is an area to be bent when accommodated in the housing of an electronic device, etc. The bend area BA is shaded with diagonal lines in the drawing. That is, the bend area BA is bent such that the wiring substrate 1 and the wiring substrate 2 will be arranged below the display area DA. The bend area BA is located in the non-display area NDA.

The support member 5 is located below the display panel PNL and is stuck to the first substrate SUB1. The support member 5 is not provided at a position opposed to the bend area BA in the third direction Z. Further, a first insulating substrate 10 has the display area DA, the bend area BA and the pad area MT.

Figure 2:
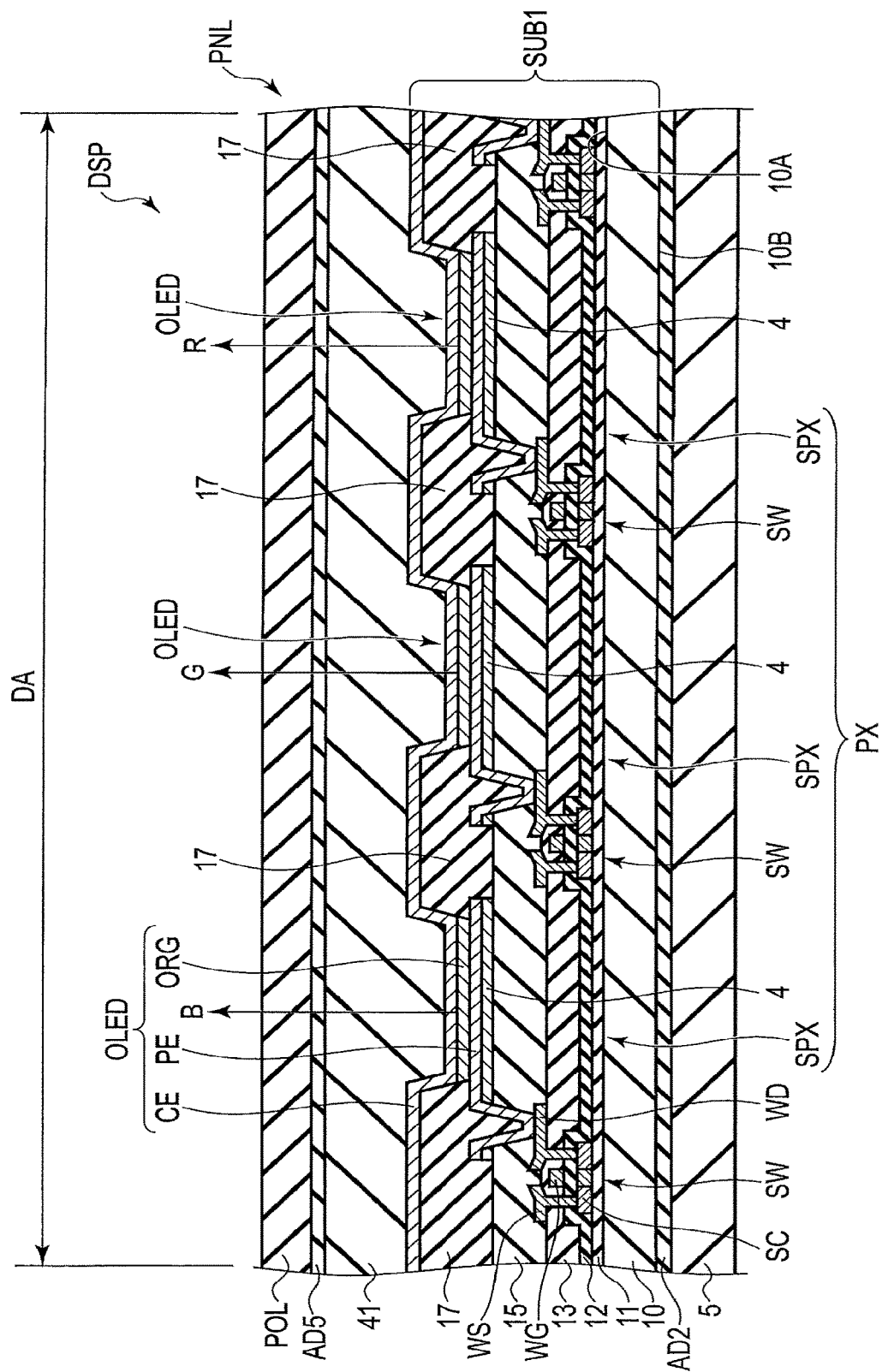
FIG. 2 is a sectional view of a display area of the display device shown in FIG. 1.

FIG. 2 is a sectional view of the display area DA of the display device DSP shown in FIG. 1.

As shown in FIG. 2, the first substrate SUB1 includes the first insulating substrate 10, a plurality of switching element SW, a plurality of light reflective layers 4, the organic EL elements OLED, a sealing layer 41, the support member 5, etc. Each pixel PX has a plurality of sub-pixels SPX. In the present embodiment, each pixel PX has three sub-pixels SPX. Each sub-pixel SPX includes one switching element SW and one organic EL element OLED, etc. The structure of one sub-pixel SPX will be described in the description of FIG. 2, but the same also applies to the structures of the other sub-pixels SPX.

The first insulating substrate 10 is formed of an organic insulating material, for example, polyimide (PI). Therefore, it may be more appropriate to refer to the first insulating substrate 10 as an organic insulating substrate (resin substrate) in some cases. It may also be more appropriate to refer to the first insulating substrate 10 as an insulating layer, an organic insulating layer or a resin layer in some cases. The first insulating substrate 10 has a first surface 10A and a second surface 10B opposite to the first surface 10A. The first insulating substrate 10 is covered with a first insulating film 11.

The switching element SW is formed on the first insulating film 11. In the example illustrated, the switching element SW is formed of a top-gate thin-film transistor but may be formed of a bottom-gate thin-film transistor. The switching element SW includes a semiconductor layer SC formed on the first insulating film 11. The semiconductor layer SC is covered with a second insulating film 12. Further, the second insulating film 12 is also arranged on the first insulating film 11.

A gate electrode WG of the switching element SW is formed on the second insulating film 12 and is located directly above the semiconductor layer SC. The gate electrode WG is covered with a third insulating film 13. Further, the third insulating film 13 is arranged also on the second insulating film 12.

The first insulating film 11, the second insulating film 12 and the third insulating film 13 are formed of an inorganic insulating material such as silicon oxide or silicon nitride, for example.

A source electrode WS and a drain electrode WD of the switching element SW are formed on the third insulating film 13. The source electrode WS and the drain electrode WD are electrically connected to the semiconductor layer SC via contact holes which penetrate the second insulating film 12 and the third insulating film 13, respectively. The switching element SW is covered with a fifth insulating film 15. The fifth insulating film 15 is also arranged on the third insulating film 13. The fifth insulating film 15 is formed of an organic insulating material such as transparent resin, for example.

The light reflective layer 4 is arranged on the fifth insulating film 15. The light reflective layer 4 is formed of a metal material having high light reflectivity such as aluminum or silver. The surface of the light reflective layer 4 (that is, the surface on the polarizer POL side) may be a flat surface or may be an uneven surface to have light scattering properties.

The organic EL element OLED is formed on the fifth insulating film 15. In the example illustrated, the organic EL element OLED is electrically connected to the switching element SW. For example, the pixel PX includes an organic EL element OLED which emits red light, an organic EL element OLED which emits green light, and an organic EL element OLED which emits blue light. The colors of light emitted from the organic EL elements OLED are not limited to those of the present embodiment and can be modified in various ways.

Unlike the present embodiment, an organic EL element OLED may emit white light. In this case, the display panel PNL may include a color filter.

The organic EL element OLED includes a pixel electrode PE formed on the light reflective layer 4. The pixel electrode PE is formed of a metal material such as aluminum or silver or may be formed of a transparent conductive material such as indium tin oxide (ITO) or indium zinc oxide (IZO), for example.

A barrier insulating layer 17 is provided on the fifth insulating film 15 and the pixel electrode PE. The barrier insulating layer 17 has a though hole at a position corresponding to the pixel electrode PE or a slit at a position corresponding to the row or column of the pixel electrodes PE. Here, the barrier insulating layer 17 has a through hole at a position corresponding to the pixel electrode PE, for example.

The organic EL element OLED further includes an organic light emitting layer ORG and a common electrode CE. One of the pixel electrode PE and the common electrode CE is an anode, and the other one of the pixel electrode PE and the common electrode CE is a cathode. The organic light emitting layer ORG is located above the pixel electrode PE.

The common electrode CE is located above the organic light emitting layer ORG and the barrier insulating layer 17. The common electrode CE is formed of a transparent conductive material such as ITO or IZO, for example. In the example illustrated, the organic EL elements OLED are partitioned with the barrier insulating layer 17. Although not illustrated in the drawing, the organic EL element OLED should preferably be sealed with a transparent sealing film.

Unlike the present embodiment, the organic EL element may be formed as the so-called bottom emission type which emits light toward the first insulating substrate 10 side. In that case, various adjustments are required for the position of the light reflective layer 4, etc.

The sealing layer 41 covers the organic EL element OLED to reduce an infiltration of oxygen and moisture, and prevents degradation of the element. The sealing layer 41 may be formed of a layered product of an inorganic film and an organic film. The polarizer POL is arranged on the sealing layer 41 via an adhesive layer AD5.

The support member 5 is a resin film and is arranged below the first substrate SUB1. The support member 5 is adhered to the second surface 10B of the first insulating substrate 10 by an adhesive layer AD2. The material of the support member 5 should preferably be a material which is excellent in thermal resistance, gas barrier properties, dampproofness and strength and is also inexpensive. The support member 5 is thermally resistant to the extent that the support member 5 will not change in quality or will not be deformed at a process temperature in a manufacturing process of the display device DSP, for example. Further, for example, the support member 5 is stronger than the first insulating substrate 10 and functions as a support layer. As the support member 5 is provided, the display panel PNL becomes less likely to be curved in a state where the display panel PNL is free from stress from the outside. Further, for example, the support member 5 has dampproofness to reduce an infiltration of moisture, etc., to the first insulating substrate 10, gas barrier properties to reduce an infiltration of gas to the first insulating substrate 10, etc., and functions as a barrier layer. In the present embodiment, the support member 5 is a film formed of polyethylene terephthalate, for example.

The pixel PX shown in FIG. 1 is the minimum unit of a color image and includes the organic EL elements OLED.

Figure 3:
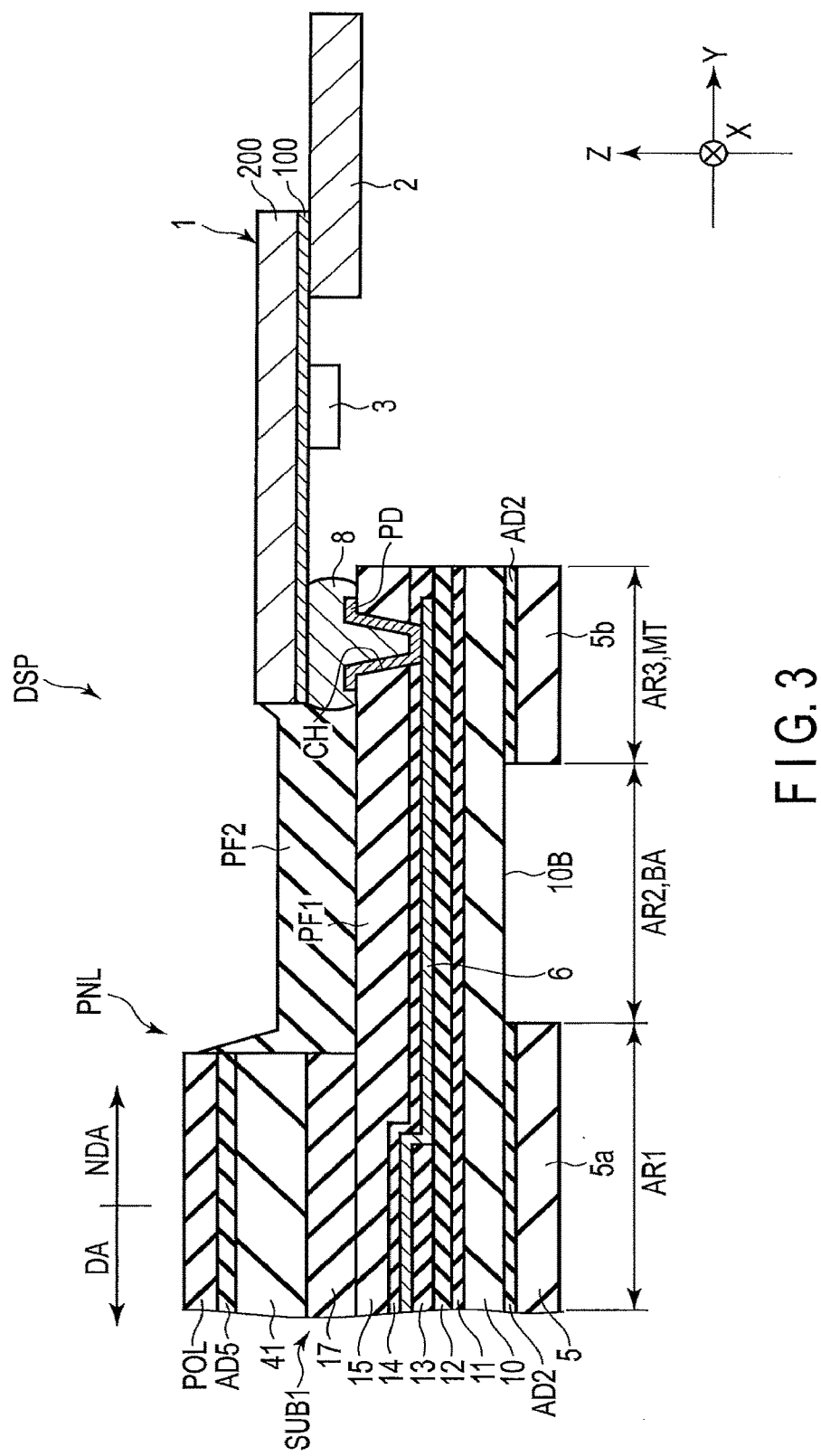
FIG. 3 is another sectional view of the display device shown in FIG. 1 and shows a non-display area, etc.

FIG. 3 is another sectional view of the display device DSP shown in FIG. 1 and shows the non-display area NDA, etc.

As shown in FIG. 3, the support member 5 has a first portion 5a and a second portion 5b arranged at a distance from the first portion 5a. Further, the display panel PNL has a first area AR1, a second area AR2 adjacent to the first area AR1, and a third area AR3 adjacent to the second area AR2. The second area AR2 is located between the first area AR1 and the third area AR3.

Here, in the present embodiment, a view from the polarizer POL to the first substrate SUB1 is defined as a plan view. The first area AR1 corresponds to an area which overlaps the first portion 5a in a plan view. The second area AR2 corresponds to an area in which the support member 5 is not provided in a plan view. The bend area BA shown also in FIG. 1 is included in the second area AR2. Alternatively, the bend area BA is an area equivalent to the second area AR2. The third area AR3 is the pad area MT and corresponds to an area which overlaps the second portion 5b in a plan view. Further, the first portion 5a is adhered to the first area AR1 by the adhesive layer AD2, and the second portion 5b is adhered to the third area AR3 by the adhesive layer AD2.

A wiring line 6 is arranged continuously from the first area AR1 to the third area AR3. The wiring line 6 corresponds to a power supply line and various control lines, etc. The first substrate SUB1 further has a fourth insulating film 14 and a second protective film PF2. The fourth insulating film 14 is arranged on the wiring line 6 and is located in the first area AR1, the second area AR2 and the third area AR3. The fifth insulating film 15 is arranged on the fourth insulating film 14. The fifth insulating film 15 is located also in the second area AR2 and the third area AR3 in addition to the display area DA (first area AR1). In the non-display area NDA, the fifth insulating film 15 is located at least in the bend area BA. The fifth insulating film 15 forms a first protective film PF1 in the bend area BA.

The second protective film PF2 is arranged on the fifth insulating film 15. The second protective film PF2 is located at least in the bend area BA. In the present embodiment, the second protective film PF2 is located also in part of the first area AR1 and the third area AR3. In the example illustrated, the second protective film PF2 covers an edge of the barrier insulating layer 17, an edge of the sealing layer 41 and an edge of an anisotropic conductive film 8 which is formed of a conductive material. A pad PD is located in the third area AR3. The pad PD is arranged on the first protective film PF1 and is electrically connected to the wiring line 6 via a contact hole CH formed in the fourth insulating film 14 and the first protective film PF1.

The wiring substrate 1 is mounted on the third area AR3 via the anisotropic conductive film 8. The wiring substrate 1 includes a core substrate 200, a connection line 100 arranged on the lower side of the core substrate 200, and a driver IC chip 3 arranged on the lower side of the core substrate 200. The driver IC chip 3 functions as a signal supply source which supplies a signal necessary for driving the display panel PNL, etc.

Here, when the bend area BA is bent, the pad PD will be arranged on the back side of the display panel PNL.

FIG. 4 is a sectional view of the display device DSP and shows a state where the bend area BA of the display panel PNL is bent.

As shown in FIG. 4, the bend area BA is bent such that the first portion 5a and the second portion 5b are opposed to each other. The display panel PNL has the second area AR2 is which the support member 5 is not provided. Therefore, the radius of curvature of the bend area BA can be reduced. A pedestal 7 is arranged between the first area AR1 and the wiring substrate 1.

An adhesive layer A1 is arranged between the first area AR1 and the pedestal 7 and bonds the first area AR1 and the pedestal 7 to each other. Further, an adhesive layer A2 is arranged between the wiring substrate 1 and the pedestal 7 and bonds the wiring substrate 1 and the pedestal 7 to each other. The adhesive layers A1 and A2 may be integrally formed with each other as shown in the drawing or may be separately formed from each other. The adhesive layers A1 and A2 are double-faced tape, for example.

The display device DSP is structured as described above.

As described above, it is possible to narrow the frame or reduce the size of an electronic device, etc., which accommodates the display panel PNL by bending the bend area BA of the display panel PNL. Further, it is possible to reduce the accommodation volume without reducing the width of the non-display area NDA. As described above, to bend the display panel PNL, the display panel PNL needs to have the second area AR2 in which the support member 5 is not provided.

Next, the non-display area NDA, in particular, the bend area BA of the display panel PNL will be described. FIG. 5 is a plan view of part of the first substrate SUB1 of the display panel PNL and shows the bend area BA, etc. FIG. 5 shows a state where the bend area BA has not been bent yet.

As shown in FIG. 5, the wiring lines 6 are elongated at least in the bend area BA. In the present embodiment, the wiring lines 6 are elongated in the second direction Y which is a direction from the first area AR1 (display area DA) to the pad area MT, and are arranged at intervals in the first direction X. When focusing on a first wiring line 6a and a second wiring line 6b among the wiring lines 6, the second wiring line 6b is elongated in the second direction Y along with the first wiring line 6a, and is arranged in the first direction X at a distance from the first wiring line 6a. Each wiring line 6 has a bend portion in the bend area BA. Each wiring line 6 winds throughout the entire bend area BA. In the present embodiment, each wiring line 6 has the shape of a wave (more specifically, the shape of a triangle wave). The bend portion in the present embodiment includes a portion in which the wiring line 6 is inclined with respect to the second direction Y.

As shown in FIG. 5, a plurality of inorganic layers IL are arranged at intervals in the first direction X in the bend area. The inorganic layers IL correspond one-to-one to the wiring lines 6. Each inorganic layer IL has a shape substantially equal to that of the corresponding wiring line 6 and is elongated along the corresponding wiring line 6 in the bend area BA. The outline of each inorganic layer IL is located outside the outline of the corresponding wiring line 6. Each inorganic layer IL has a lower layer BL and an upper layer UL.

The first protective film PF1 (fifth insulating film 15) covers the wiring lines 6 located at least in the bend area BA. In the present embodiment, the first protective film PF1 is a single film which covers the entire bend area BA and is formed continuously in the first direction X from the left side of the leftmost wiring line 6 (6a) to the right side of the rightmost wiring line 6. The first protective film PF1 is formed continuously in an area between the wiring lines 6. The second protective film PF2 is arranged in part of the first area AR1, the bend area BA and part of the pad area MT. The second protective film PF2 is located at least in the bend area BA and covers the first protective film PF1.

FIG. 6 is a sectional view of the first substrate SUB1 taken along line VI-VI of FIG. 5.

As shown in FIG. 6, the lower layers BL which include a first lower layer BLa and a second lower layer BLb are provided on the first insulating substrate 10 and are in contact with the first insulating substrate 10. The lower layers BL are formed of an inorganic insulating material. The lower layers BL are formed of a layered product of the patterned first insulating film 11 and second insulating film 12. Here, the first insulating film 11 is formed of silicon nitride, and the second insulating film 12 is formed of silicon oxide.

The upper layers UL which include a first upper layer ULa and a second upper layer ULb are provided on the corresponding lower layers BL, respectively. The upper layers UL are formed of an inorganic insulating material. In the present embodiment, the outlines (side surfaces) of the upper layers UL are aligned with the outlines (side surfaces) of the lower layers EL in the thickness direction of the first substrate SUB1. Unlike the present embodiment, the outlines of the upper layers UL may not be aligned with the outlines of the lower layers BL in the thickness direction. The upper layers UL are formed of the patterned fourth insulating film 14. Here, the fourth insulating film 14 is formed of silicon nitride.

Each wiring line 6 is sandwiched between the lower layer BL and the upper layer UL. The lower layers BL constitute a first insulating layer INS1. The upper layers UL constitute a second insulating layer INS2. Therefore, the wiring lines 6 are located between the first insulating layer INS1 and the second insulating layer INS2. Further, in the bend area BA, the first insulating layer INS1 and the second insulating layer INS2 are formed separately for each of the wiring lines 6 in the bend area BA. For example, the first wiring line 6a is sandwiched between the first lower layer BLa and the first upper layer ULa, and the second wiring line 6b is sandwiched between the second lower layer BLb and the second upper layer ULb. The first upper layer ULa is in contact with the first lower layer BLa outside the first wiring line 6a, and the second upper layer ULb is in contact with the second lower layer BLb outside the second wiring line 6b. The lower layer BL and the upper layer UL can reduce the infiltration of moisture to the wiring line 6 from the outside. As a result, degradation (corrosion) of the wiring line 6 can be prevented.

The wiring line 6 is made from metal. In the present embodiment, the wiring line 6 is a layered product of a first conductive layer L1 formed of titanium (Ti) or titanium nitride (TiN), a second conductive layer L2 formed of aluminum (Al) or aluminum alloy, and a third conductive layer L3 formed of TiN or TiN in order. Further, the wiring line 6, the source electrode WS and the drain electrode WD are formed of the same materials in the same layer.

However, the structure of the wiring line 6 is not limited to that of the present embodiment and can be modified in various ways. For example, the wiring line 6 can be formed without the first conductive layer L1. The wiring line 6 may be formed of a layered product of two layers or four layers or more, or may be formed of a single layer. The wiring line 6 is not necessarily formed of the above-described materials and may be formed of another metal material such as copper (Cu). Further, the wiring line 6 may be formed of materials different from those of the source electrode WS, etc., and may be located in a layer different from that of the source electrode WS, etc.

The first protective film PF1 is provided on the first insulating substrate 10 and the upper layers UL and covers the upper layers UL. The first protective film PF1 is formed of an organic insulating material. Unlike the present embodiment, the fifth insulating film 15 may not be formed in the bend area BA, and in that case, the first protective film PF1 formed of an organic insulating material different from the material of the fifth insulating film 15 will be formed at least in the bend area BA.

The second protective film PF2 is provided on the first insulating substrate 10 and the first protective film PF1 and covers the first protective film PF1. The second protective film PF2 is formed of an organic insulating material which is different from the material of the first protective film PF1. For example, the second protective film PF2 is formed of photocurable acrylic resin. The second protective film PF2 formed of acrylic resin has dampproofness and reduces the infiltration of moisture, etc.

A glass-transition temperature Tg1 of the first protective film PF1 is outside an operating temperature range of the display device DSP. That is, the glass-transition temperature Tg1 is higher than the upper limit of the operating temperature range or lower than the lower limit of the operating temperature range. The glass-transition temperature Tg1 should preferably be higher than the upper limit of the operating temperature range. More preferably, the glass-transition temperature Tg1 should be higher than the upper limit of a storage temperature range of the display device DSP. The glass-transition temperature Tg1 of the first protective film PF1 is less than −40° C. or more than 85° C. In the present embodiment, the glass-transition temperature Tg1 is 100° C. or more, and a glass-transition temperature Tg2 of the second protective film PF2 is approximately 50° C. Therefore, the glass-transition temperature Tg1 of the first protective film PF1 is higher than the glass-transition temperature Tg2 of the second protective film PF2. As is evident from the above description, the first protective film PF1 is closer to the wiring line 6 than the second protective film PF2.

If the display device DSP is repeatedly subjected to a change in temperature between a high temperature environment and a low temperature environment in the operating temperature range, even when temperature change occurs in the first protective film PF1, the temperature of the first protective film PF1 will be prevented from exceeding the glass-transition temperature Tg1. As expansion and contraction of the first protective film PF1 is prevented, the first protective film PF1 can prevent thermal stress applied to the wiring line 6 and the inorganic layer IL. The thermal stress is tensile stress and compression stress. Even if the temperature of the second protective film PF2 exceeds the glass-transition temperature Tg2, the first protective film PF1 can absorb and reduce thermal stress applied from the second protective film PF2. Accordingly, breakage of the wiring line 6 such as disconnection of the wiring line 6, cracks in the wiring line 6 and detachment of the wiring line 6 can be prevented. As a result, the highly-reliable wiring line 6 can be obtained in the bend area BA.

In the first protective film PF1 and the second protective film PF2 which are formed of organic insulating materials, if the temperatures exceed the glass-transition temperatures, coefficients of thermal expansion increase approximately two to five times. Therefore, the amounts of deformation of the first protective film PF1 and the second protective film PF2 by temperature change when the temperatures exceed the glass-transition temperatures may increase at least several times than when the temperatures do not exceed the glass-transition temperatures.

For example, if the display device DSP is formed without the first protective film PF1 and is repeatedly subjected to temperature change between the high temperature environment and the low temperature environment in the range of the operating temperature or the storage temperature and the temperature of the second protective film PF2 exceeds the glass-transition temperature Tg2, high thermal stress will be applied from the second protective film PF2 to the wiring line 6 which has relatively a low coefficient of thermal expansion, and therefore the wiring line 6 will be more likely to be broken.

Here, a coefficient of thermal expansion α1 of a member formed of polyimide (PI) such as the first insulating substrate 10, a coefficient of thermal expansion α2 of members formed of silicon nitride (SiN) such as the first insulating film 11 and the fourth insulating film 14, a coefficient of thermal expansion α3 of a member formed of silicon oxide (SiO) such as the second insulating film 12, a coefficient of thermal expansion α4 of a member formed of aluminum (Al) such as the second conductive layer L2, and a coefficient of thermal expansion α5 of members formed of titanium nitride (TiN) such as the first conductive layer L1 and the third conductive layer L3 are as follows. A coefficient of thermal expansion α6 of a member formed of titanium (Ti) instead of TiN is also described below.

PI: $\alpha 1 = 10$ to $40$ $[10^{-6}/°$ C.$]$
SiN: $\alpha 2 = 2.5$ to $2.9$ $[10^{-6}/°$ C.$]$
SiO: $\alpha 3 = 0.6$ to $0.9$ $[10^{-6}/°$ C.$]$
Al: $\alpha 4 = 23$ $[10^{-6}/°$ C.$]$
TiN: $\alpha 5 = 7.4$ $[10^{-6}/°$ C.$]$
Ti: $\alpha 6 = 8.6$ $[10^{-6}/°$ C.$]$ In addition to the thermal stress, bending stress is also applied to the wiring line 6 located in the bend area BA. If the temperature changes across the glass-transition temperature of a constituent material, the Young's modulus of the constituent material decreases around the glass-transition temperature, and this induces a change in bending stress in association with a shift in neutral plane. Therefore, the glass-transition temperature of each component should preferably be outside the operating temperature range.

Therefore, in the present embodiment, the Young's modulus and the thickness of each component are adjusted on a virtual reference line RL such that a neutral plane will be located near the wiring line 6 in the bend area BA. Here, the reference line RL is a straight line which perpendicularly intersects a surface (first surface 10A) of the first insulating substrate 10 which is opposed to the wiring line 6 and passes through the wiring line 6.

Accordingly, the wiring line 6 will be prevented from being broken by bending stress in the present embodiment.

To control the neutral plane, the first protective film PF1 should preferably be formed of the same material as that of the first insulating substrate 10, that is, polyimide. In this case, in light of dampproofness, the second protective film PF2 formed of acrylic resin is arranged on the first protective film PF1.

Further, the wiring line 6 has a bend portion in the bend area BA and includes a portion which is inclined with respect to the second direction Y. In the present embodiment, the wiring line 6 winds several times. Therefore, as compared to a case where the wiring line 6 is linearly elongated in the second direction Y, the wiring line 6 is less likely to be subjected to the negative impact of bending stress.

Here, the reliability of the display device DSP of the present embodiment was tested. As the first reliability test, the display device DSP of the present embodiment was subjected to a high-temperature and humid environment in which the temperature was 60° C. and the humidity was 90% for a long time. As the second reliability test, the display device DSP of the present embodiment underwent a temperature cycling test, and the display device DSP was subjected to a low temperature environment in which the temperature was −20° C. for one hour and was then subjected to a high temperature environment in which the temperature was 60° C. for one hour. The wiring line 6 was not broken in both the first reliability test and the second reliability test.

According to the display device of the first embodiment which is structured as described above, the display device DSP includes at least the first insulating substrate 10, the first lower layer BLa, the first upper layer ULa, the first wiring line 6a, the first protective film PF1 and the second protective film PF2. The second protective film PF2 is formed of an organic insulating material which is different from the material of the first protective film PF1. In the present embodiment, the glass-transition temperature Tg1 of the first protective film PF1 is higher than the glass-transition temperature Tg2 of the second protective film PF2.

Accordingly, the display device DSP having a high manufacturing yield can be obtained. Further, the display device DSP having the highly-reliable wiring line 6 in the bend area BA can be obtained.

Modification Example 1 of First Embodiment

Next, a display device according to modification example 1 of the first embodiment will be described.

As shown in FIG. 7, the wiring line 6 may be linearly elongated in the second direction Y in the bend area BA. The wiring line 6 does not have a bend portion in the bend area BA. Each inorganic layer IL is opposed to the corresponding wiring line 6 and is elongated along the corresponding wiring line 6. The wiring line 6 of modification example 1 is less likely to be subjected to the negative impact of thermal stress as compared to the wiring line 6 having a bend portion in the bend area BA.

Modification Example 2 of First Embodiment

Next, a display device according to modification example 2 of the first embodiment will be described.

As shown in FIG. 8, the wiring line 6 may include a first linear portion 61 elongated linearly in a direction which is inclined with respect to the second direction Y and is also inclined with respect to the first direction X, a second linear portion 62 elongated linearly in the second direction Y, and a third linear portion 63 elongated linearly in the second direction Y.

The first linear portion 61 is located in the bend area BA and is located at a distance from the first area AR1 and the pad area MT. The first linear portion 61 is provided across a bend axis AX. Here, the bend axis AX is a reference axis for bending the first substrate SUB1. In a state where the bend area BA of the first substrate SUB1 is bent, the tangent line of the first substrate SUB1 at the position of the bend axis AX is parallel to the third direction Z.

The second linear portion 62 is provided across a first boundary BO1 between the bend area BA (second area AR2) and the first area AR1, and is continuous with the first linear portion 61. The third linear portion 63 is provided across a second boundary BO2 between the bend area BA (second area AR2) and the pad area MT (third area AR3), and is continuous with the first linear portion 61.

As described above, the wiring line 6 includes has the first linear portion 61 which is inclined with respect to the second direction Y. Therefore, the wiring line 6 is less likely to be subjected to the negative impact of bending stress in modification example 2.

Modification Example 3 of First Embodiment

Next, a display device according to modification example 3 of the first embodiment will be described.

As shown in FIG. 9, the wiring line 6 includes the first linear portion 61, the second linear portion 62 and the third linear portion 63. The first linear portion 61 is elongated on the first area AR1 side beyond the first boundary BO1 and is elongated on the pad area MT side beyond the second boundary BO2.

As described above, in modification example 3 also, the wiring line 6 includes the first linear portion 61 which is inclined with respect to the second direction Y, and therefore the wiring line 6 is less likely to be subjected to the negative impact of bending stress.

Modification Example 4 of First Embodiment

Next, a display device according to modification example 4 of the first embodiment will be described.

As shown in FIG. 10, the wiring line 6 is elongated in the second direction Y as in the case of modification example 1. Modification example 4 differs from modification example 1 in that the entire wiring line 6 winds in the bend area BA and differs from the first embodiment shown in FIG. 5 in that the wiring line 6 does not winds several times.

As described above, in modification example 4 also, the wiring line 6 has a portion which is inclined with respect to the second direction Y, and therefore the wiring line 6 is less like to be subjected to the negative impact of bending stress.

Modification Example 5 of First Embodiment

Next, a display device according to modification example 5 of the first embodiment will be described.

As shown in FIG. 11, the first protective film PF1 may include a plurality of divisions DI such as a first division DI1 and a second division DI2. The first division DI1 covers the first upper layer ULa and is elongated in the second direction Y. The second division DI2 covers the second upper layer ULb, is elongated in the second direction Y, and is located at a distance from the first division DI1 in the first direction X. In a plan view, each division DI covers the entire corresponding wiring line 6 and the entire corresponding inorganic layer IL in the bend area BA. In other words, the first protective film PF1 may be formed separately for each of the wiring lines 6. In modification example 5, the divisions DI including the first division DI1 and the second division DI2 are formed into strips and linearly extend in the second direction Y.

Further, the first protective film PF1 of modification example 5 is provided independently from the fifth insulating film 15 and is located at least in the bend area BA.

As described above, the wiring line 6 may be individually covered with the division DI of the first protective film PF1. Therefore, the wiring line 6 which is less likely to subjected to the negative impact of thermal stress can be obtained also in modification example 5.

Modification Example 6 of First Embodiment

Figure 12:
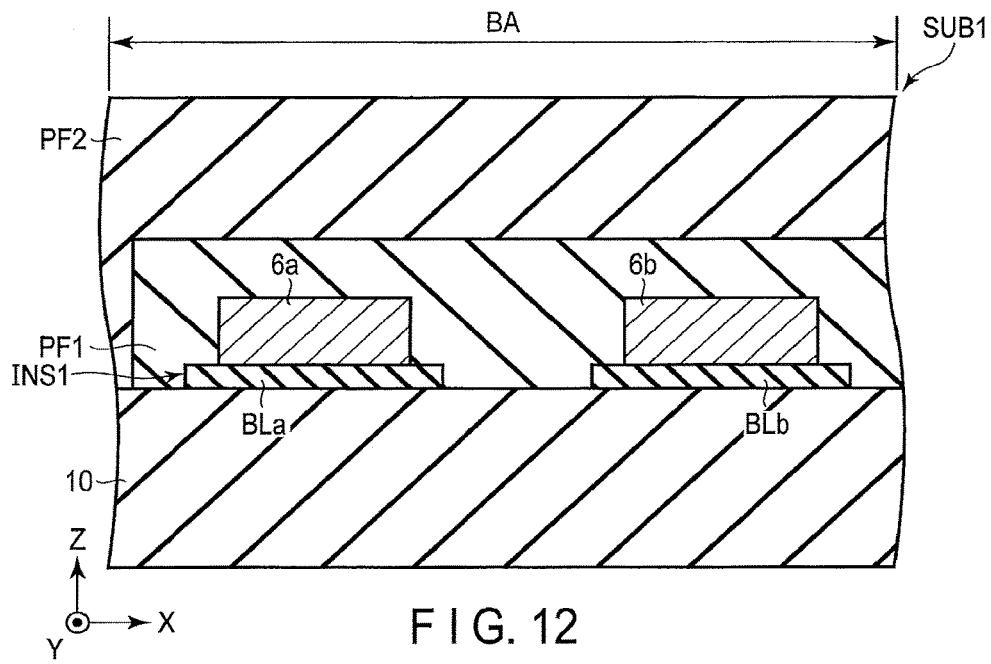
FIG. 12 is a sectional view showing a bend area of part of a first substrate of a display panel according to modification example 6 of the first embodiment.

Next, a display device according to modification example 6 of the first embodiment will be described. FIG. 12 shows a state where the bend area BA has not been bent yet.

As shown in FIG. 12, the first substrate SUB1 may be formed without the upper layer UL. The wiring line 6 is not covered with the upper layer UL in the bend area BA.

The same effect as that produced from the first embodiment can be produced from modification example 6. The second protective film PF2 can be formed of a dampproof material such as acrylic resin. In that case, the second protective film PF2 can reduce the infiltration of moisture to the wiring line 6.

Modification Example 7 of First Embodiment

Figure 13:
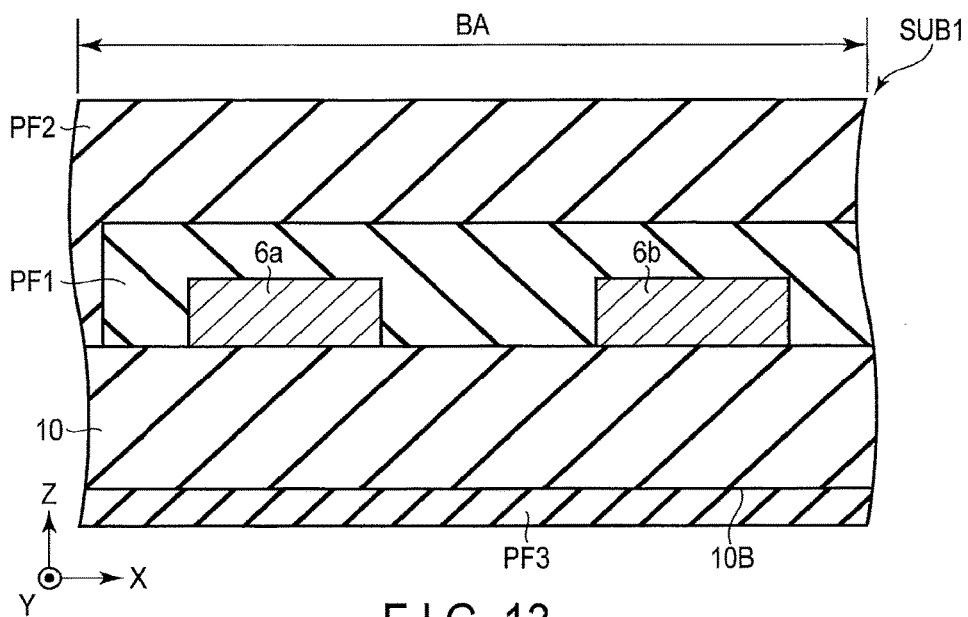
FIG. 13 is a sectional view showing a bend area of part of a first substrate of a display panel according to modification example 7 of the first embodiment.

Next, a display device according to modification example 7 of the first embodiment will be described. FIG. 13 shows a state where the bend area BA has not been bent yet.

As shown in FIG. 13, the first substrate SUB1 may be formed without the upper layer UL and the lower layer BL. In the bend area BA, the wiring line 6 is not surrounded by the upper layer UL and the lower layer BL.

The first substrate SUB1 further includes a third protective film PF3. In the example shown in FIG. 13, the third protective film PF3 is located on the second surface 10B side of the first insulating substrate 10. In other words, the first insulating substrate 10 is arranged on the third protective film PF3. In an area other than the bend area BA, the third protective film PF3 is located between the first insulating substrate 10 and the support member 5.

The second protective film PF2 and the third protective film PF3 can be formed of a dampproof material such as acrylic resin. In that case, the second protective film PF2 and the third protective film PF3 can reduce the infiltration of moisture to the wiring line 6.

Unlike modification example 7, the third protective film PF3 may be located between the first insulating substrate 10 and the wiring line 6. Further, the third protective film PF3 may be formed of a layered product of a thin inorganic film and a thin organic film. Still further, the first substrate SUB1 may be formed without the third protective film PF3.

The same effect as that produced from the first embodiment can be produced from modification example 7. The second protective film PF2 and the third protective film PF3 can be formed of a dampproof material such as acrylic resin. In that case, the second protective film PF2 and the third protective film PF3 can reduce the infiltration of moisture to the wiring line 6.

Second Embodiment

Next, a display device according to the second embodiment will be described. FIG. 14 is a sectional view of the display device DSP according to the second embodiment and shows the non-display area NDA, etc.

As shown in FIG. 14, the second embodiment differs from the first embodiment in that the first substrate SUB1 is formed without the second protective film PF2.

The first protective film PF1 of the second embodiment is provided independently from the fifth insulating film 15 and is located at least in the bend area BA. For example, the first protective film PF1 is formed of photocurable acrylic resin. An edge of the fifth insulating film 15 and an edge of the barrier insulating layer 17 on the second area AR2 side are covered with the sealing layer 41. In the example illustrated, the first protective film PF1 covers an edge of the sealing layer 41 and an edge of the anisotropic conductive film 8.

Figure 15:
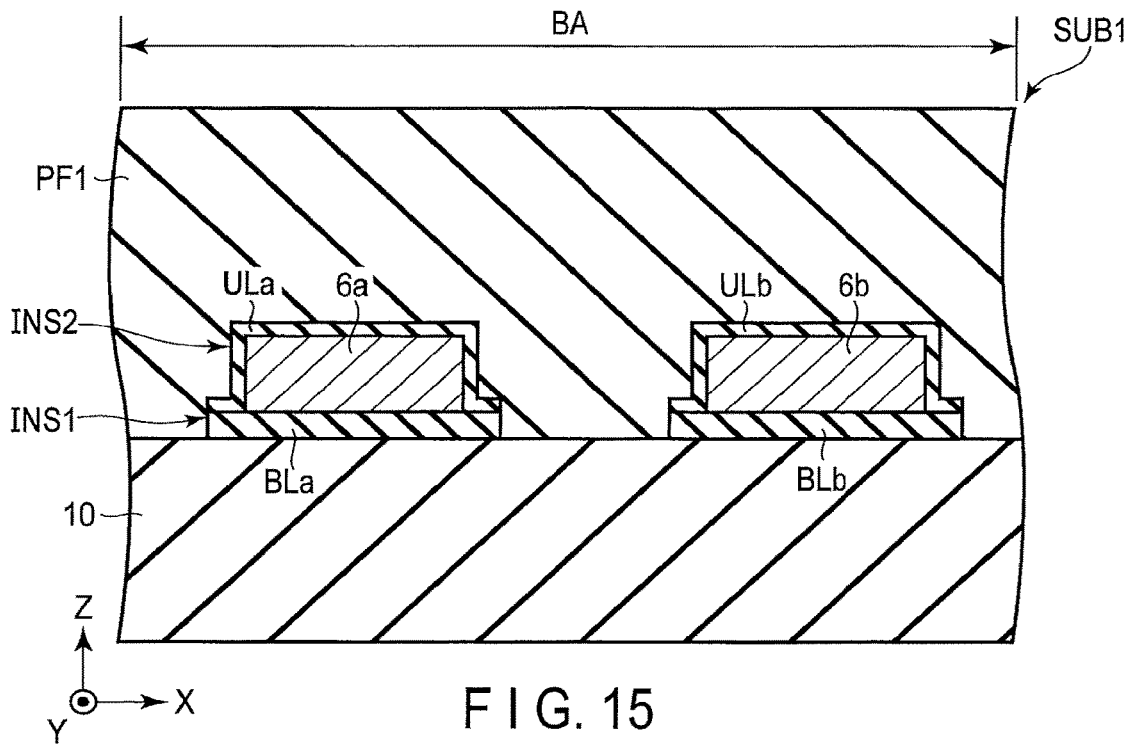
FIG. 15 is a sectional view showing a bend area of a first substrate of a display panel according to the second embodiment.

FIG. 15 shows a sectional view showing the bend area BA of the first substrate SUB1 of the display panel PNL according to the second embodiment. FIG. 15 shows a state where the bend area BA has not been bent yet.

In FIG. 15, the glass-transition temperature Tg1 of the first protective film PF1 is outside the operating temperature range of the display device DSP. The glass-transition temperature Tg1 of the first protective film PF1 is less than −40° C. or more than 85° C. In the present embodiment, the glass-transition temperature Tg1 is approximately 100° C. Even if temperature change occurs in the first protective film PF1, the first protective film PF1 can prevent thermal stress applied to the wiring line 6 and the inorganic layer IL.

Here, the reliability of the display device DSP of the present embodiment was tested. As the first reliability test, the display device DSP of the present embodiment was subjected to a high-temperature and humid environment in which the temperature was 60° C. and the humidity was 90% for a long time. As the second reliability test, the display device DSP of the present embodiment underwent a temperature cycling test, and the display device DSP was subjected to a lower temperature environment in which the temperature was −20° C. for one hour and was then subjected to a high temperature environment in which the temperature was 60° C. for one hour. The wiring line 6 was not broken in both the first reliability test and the second reliability test.

According to the display device of the second embodiment which is structured as described above, the display device DSP includes at least the first insulating substrate 10, the first wiring line 6a and the first protective film PF1. The glass-transition temperature Tg1 of the first protective film PF1 exceeds 85° C.

Accordingly, the display device DSP having a high manufacturing yield can be obtained also in the second embodiment. Further, the display device DSP having the highly-reliable wiring line 6 in the bend area BA can be obtained.

Modification Example 1 of Second Embodiment

Figure 16:
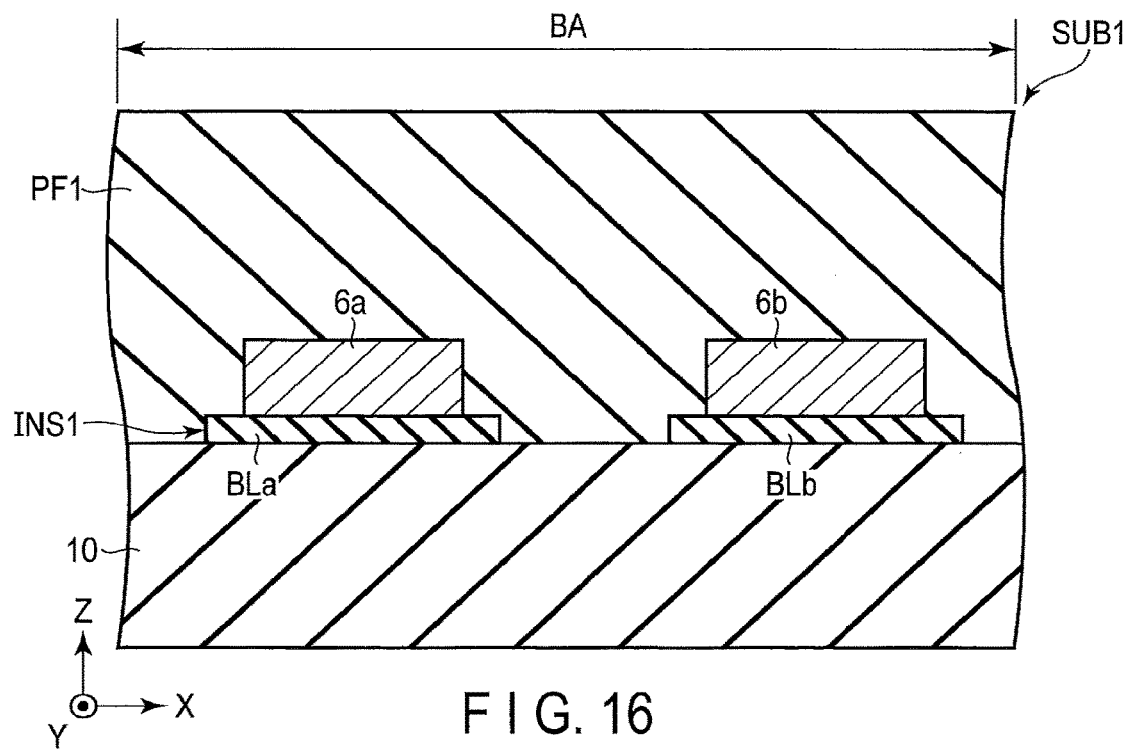
FIG. 16 is a sectional view showing a bend area of a first substrate of a display panel according to modification example 1 of the second embodiment.

Next, a display device according to modification example 1 of the second embodiment will be described. FIG. 16 shows a state where the bend area BA has not been bent yet.

As shown in FIG. 16, the first substrate SUB1 may be formed without the upper layer UL.

The same effect as that produced from the second embodiment can be produced from modification example 1. Further, as in the case of the second embodiment, the first protective film PF1 can be formed of a dampproof material such as acrylic resin. In that case, the first protective film PF1 can reduce the infiltration of moisture to the wiring line 6.

Modification Example 2 of Second Embodiment

Figure 17:
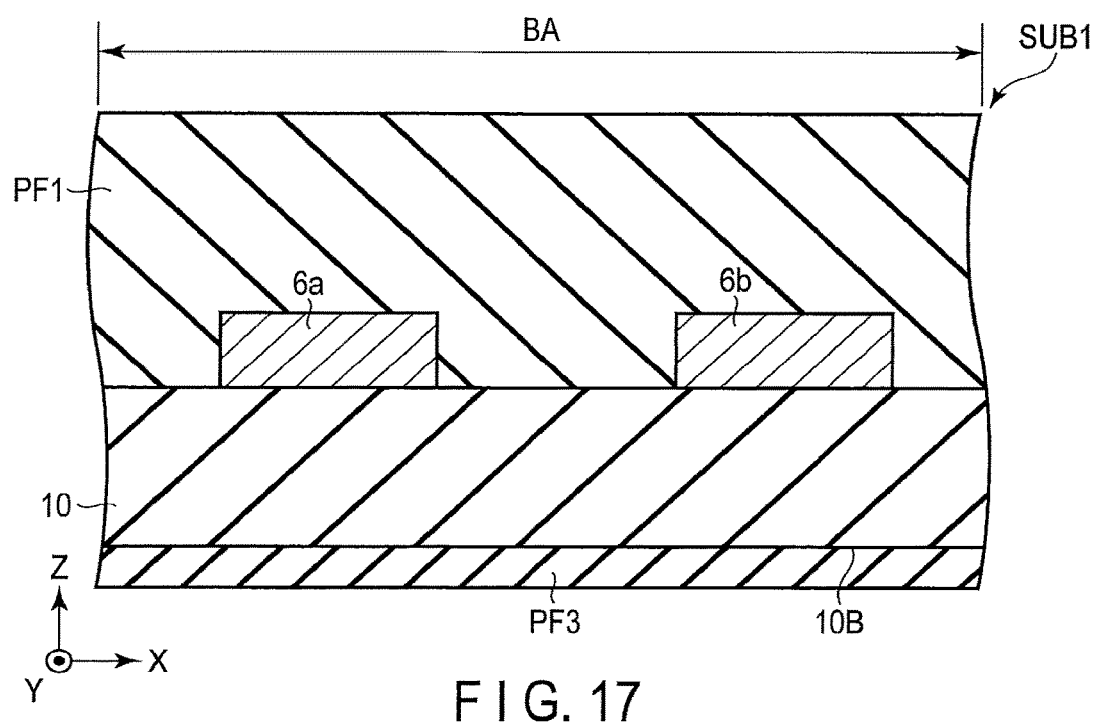
FIG. 17 is a sectional view showing a bend area of a first substrate of a display panel according to modification example 2 of the second embodiment.

Next, a display device according to modification example 2 of the second embodiment will be described. FIG. 17 shows a state where the bend area BA has not been bent yet.

As shown in FIG. 17, the first substrate SUB1 may be formed without the upper layer UL and the lower layer BL.

The first substrate SUB1 further includes the third protective film PF3. In the example shown in FIG. 17, the third protective film PF3 is located on the second surface 10B side of the first insulating substrate 10. The third protective film PF3 can be formed of a dampproof material such as acrylic resin.

The same effect as that produced from the second embodiment can be produced from modification example 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification examples as would fall within the scope and spirit of the inventions. It is possible to combine two or more of the embodiments and modification examples with each other if needed.

For example, the above-described display panel and the above-described display device are not limited to an organic EL display panel and an organic EL display device. For example, the above-described embodiments can be applied to a liquid crystal display panel which includes a liquid crystal element as an electro-optical element, and a liquid crystal display device. In that case, the display panel PNL is a liquid crystal display panel, and for example, the display panel PNL includes the first substrate SUB1, a second substrate, a liquid crystal layer held between the first substrate and the second substrate, and if necessary, polarizers on both the upper side and the lower side of the liquid crystal layer.

What is claimed is:

1. A display device comprising:
   an insulating substrate which has a display area, a pad area and a bend area located between the display area and the pad area;
   a plurality of wiring lines which are formed on the insulating substrate and are elongated from the display area to the pad area;
   a first protective film which is located on the insulating substrate and the wiring lines in the bend area and is formed of an organic insulating material; and
   a second protective film which is located on the first protective film in the bend area and is formed of an organic insulating material different from the organic insulating material of the first protective film,
   wherein
   the first protective film is formed separately for each of the wiring lines.

2. The display device of claim 1, wherein a glass-transition temperature of the first protective film is higher than a glass-transition temperature of the second protective film.

3. The display device of claim 1, wherein each of the wiring lines has a bend portion in the bend area.

4. The display device of claim 1, further comprising:
   a first insulating layer formed on the insulating substrate; and
   a second insulating layer formed on the first insulating layer,
   wherein
   the wiring lines are located between the first insulating layer and the second insulating layer.

5. The display device of claim 4, wherein the first insulating layer and the second insulating layer are inorganic insulating layers.

6. The display device of claim 4, wherein the first insulating layer and the second insulating layer have shapes which are substantially equal to a shape of the wiring lines in the bend area.

7. The display device of claim 4, wherein the first insulating layer and the second insulating layer are formed separately for each of the wiring lines.

8. A display device comprising:
   an insulating substrate which has a display area, a pad area, and a bend area located between the display area and the pad area;
   a first insulating layer formed on the insulating substrate;
   a second insulating layer formed on the first insulating layer;
   a plurality of wiring lines which are formed between the first insulating layer and the second insulating layer and are elongated from the display area to the pad area;
   a first protective film which is located on the insulating substrate and the wiring lines in the bend area, and is formed of an organic insulating material; and
   a second protective film which is located on the first protective film in the bend area and is formed of an organic insulating material different from the organic insulating material of the first protective film,
   wherein
   a glass-transition temperature of the first protective film is higher than a glass-transition temperature of the second protective film.

* * * * *